(12) United States Patent
Nakasha

(10) Patent No.: US 8,437,423 B2
(45) Date of Patent: May 7, 2013

(54) TRANSMISSION DEVICE

(75) Inventor: Yasuhiro Nakasha, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 760 days.

(21) Appl. No.: 12/577,289

(22) Filed: Oct. 12, 2009

(65) Prior Publication Data
US 2010/0091833 A1    Apr. 15, 2010

(30) Foreign Application Priority Data
Oct. 15, 2008   (JP) ................................ 2008-266818

(51) Int. Cl.
*H04L 27/00*    (2006.01)

(52) U.S. Cl.
USPC ............ 375/295; 375/238; 370/205; 370/212

(58) Field of Classification Search .................. 375/238, 375/295; 340/870.24; 398/189; 370/205, 370/212
See application file for complete search history.

(56) References Cited

U.S. PATENT DOCUMENTS

| 8,054,908 B2 | 11/2011 | Nakasha et al. |
| 2006/0140253 A1 | 6/2006 | Maeki et al. |
| 2006/0158370 A1* | 7/2006 | Kurashima et al. ........... 342/118 |
| 2008/0056419 A1* | 3/2008 | Lee et al. ...................... 375/355 |
| 2009/0072876 A1* | 3/2009 | Kim et al. ..................... 327/294 |

FOREIGN PATENT DOCUMENTS

| JP | 2006-303705 A | 11/2006 |
| JP | 2008-205733 | 9/2008 |

OTHER PUBLICATIONS

"Japanese Office Action" mailed by JPO and corresponding to Japanese application No. 2008-266818 on Jun. 19, 2012, with partial English translation.

* cited by examiner

*Primary Examiner* — Curtis Odom
(74) *Attorney, Agent, or Firm* — Fujitsu Patent Center

(57) ABSTRACT

A transmission device including a pulse generating section configured to generate a plurality of pulses using a signal of data and a signal obtained by delaying the signal of data, and to adjust the pulse width such that each of the plurality of pulses has a pulse width conforming to a sequence of the data; a band-pass filter filtering the plurality of pulses; and a transmission amplifier amplifying the filtered plurality of pulses and outputting the filtered plurality of pulses as a transmission signal.

18 Claims, 14 Drawing Sheets

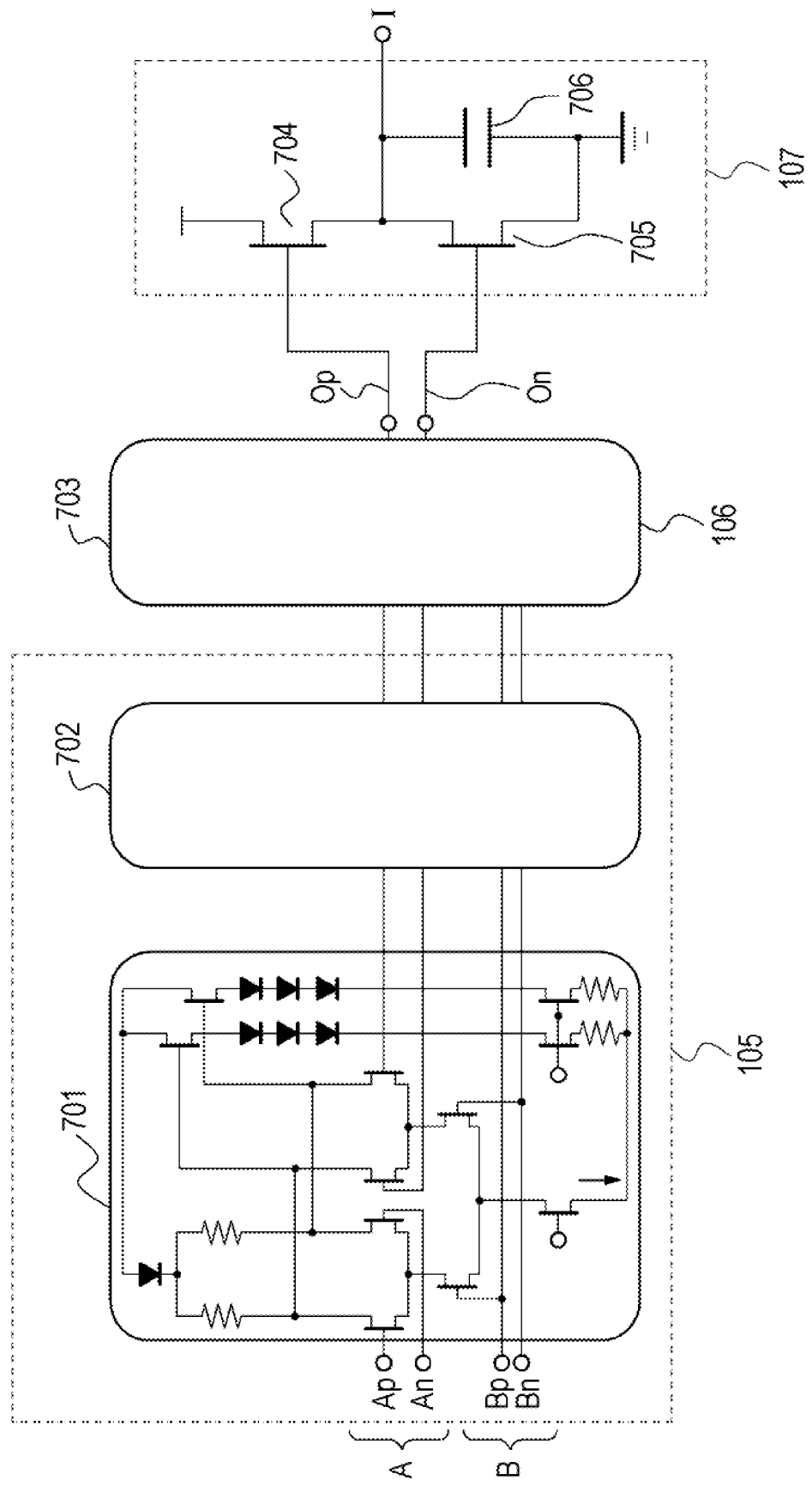

TRANSMISSION DEVICE

CROSS REFERENCE TO RELATED APPLICATION

This application is based upon and claims the benefit of priority from prior Japanese Patent Application No. 2008-266818, filed on Oct. 15, 2008, the entire contents of which are incorporated herein by reference.

FIELD

The present invention relates to a transmission device.

BACKGROUND

As a transmission device used in a pulsed radio communication system, for example, a transmission device described in Japanese Laid-Open Patent Publication No. 2006-303705 has been disclosed. In the transmission device mentioned above, a rectangular signal (a pulse signal) which is generated from an XOR circuit using a delayed clock signal is applied to a transmission signal generating section in which, then, the applied signal is modulated using a data signal and is output as a transmission signal. An RF switch configured to turn on/off the pulse signal in accordance with the data signal is used in the transmission signal generating section. As long as the frequency band for use in a pulsed radio communication system is on the order of the magnitude of microwave bands, no serious problem may occur. However, if the frequency band reaches the magnitude of millimeter wave bands exceeding 30 GHz, wide-band and high-speed switching characteristics will be demanded for the RF switch. However, a wide-band and high-speed RF switch is highly costly and large-sized, so that the size and the manufacturing cost of a transmission device using the RF switch of this type are increased.

SUMMARY

Accordingly, it is an object of an aspect of the invention to provide a transmission device including a pulse generating section configured to generate a plurality of pulses using a signal of data and a signal obtained by delaying the signal of the data, and to adjust the pulse width such that each of the plurality of pulses has a pulse width conforming to a sequence of the data; a band-pass filter filtering the plurality of pulses; and a transmission amplifier amplifying the filtered plurality of pulses and outputting the filtered plurality of pulses as a transmission signal.

According to another aspect of the invention, a transmission device includes a pulse generating section configured to generate a plurality of pulses in accordance with a signal of data, a band-pass filter configured to filter the plurality of pulses, and a transmission amplifier configured to amplify each of the filtered plurality of pulses at an amplification ratio conforming to a sequence of the data and to output the amplified pulses as a transmission signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 7 is a circuit diagram illustrating structural examples of a zero detecting section, a delay unit, and an integrator;

DESCRIPTION OF EMBODIMENTS

Figure 2A:
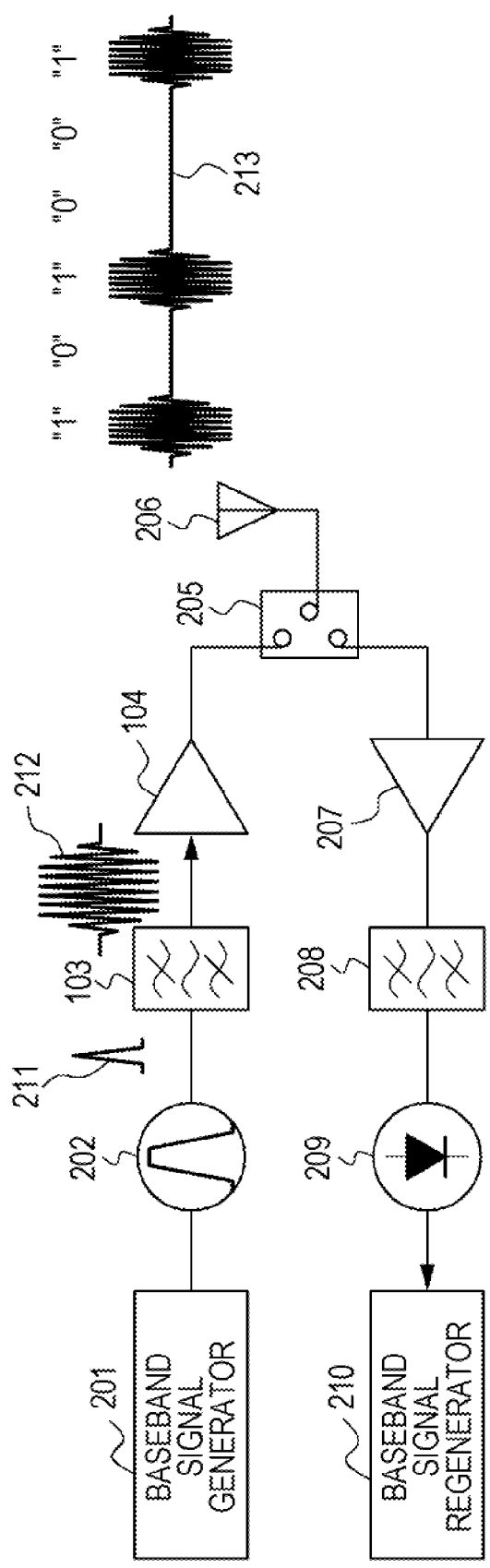
FIG. 2A is a diagram illustrating a structural example of a pulsed radio communication system.
Figure 2B:
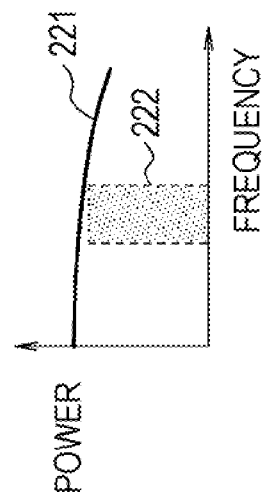
FIG. 2B is a diagram illustrating a pass band of a band-pass filter.

FIG. 2A is a diagram illustrating a structural example of a pulsed radio communication system and FIG. 2B is a diagram illustrating a pass band of a band-pass filter 103. The pulsed radio communication system includes a baseband signal generator 201, a pulse generator 202, the band-pass filter 103, a transmission amplifier 104, a switch 205, an antenna 206, a reception amplifier 207, a band-pass filter 208, a detector 209, and a baseband signal regenerator 210. A transmission device has the baseband signal generator 201, the pulse generator 202, the band-pass filter 103, and the transmission amplifier 104. A reception device has the baseband signal regenerator 210, the detector 209, the band-pass filter 208 and the reception amplifier 207.

First, the transmission device will be described. The baseband signal generator 201 generates time-slot-based data and outputs the generated data to the pulse generator 202. The data rises to a high level with a binary "1" and drops to a low level with a binary "0". When the data rises to the high level, the pulse generator 202 generates a pulse 211 (for example, an impulse). The band-pass filter 103 performs filtering on the pulse 211 such that the pulse passes only through a specific pass band and outputs a wavelet (hereinafter, referred to as a wavelet) 212.

FIG. 2B illustrates a pass band 222 of the band-pass filter 103. A pulse characteristic 221 indicates a frequency characteristic of the pulse 211. The wavelet 212 has a frequency component corresponding to only the part of the pass band 222 in the pulse characteristic 221. In Ultra Wide Band (UWB) radio communication, available frequency bands are limited. The band-pass filter 103 is used to compensate for the limitation on the frequency bands.

The transmission amplifier 104 amplifies the wavelet 212 and radio-transmits a transmission signal 213 via the switch 205 and the antenna 206. The transmission signal 213 indicates "1" or "0" depending on whether the wavelet is present, for example, as illustrated in FIG. 2A.

Next, the reception device will be described. The reception amplifier 207 receives a reception signal via the antenna 206 and the switch 205 and amplifies the signal. The band-pass filter 208 performs filtering on the signal output from the reception amplifier 207 such that the signal passes only through a given pass band. The detector 209 detects the signal output from the band-pass filter 208 and outputs the detected signal. The baseband signal regenerator 210 receives the signal output from the detector 209 to regenerate the reception data.

Pulsed radio communication systems may be used in ultra wide band (UWB) radio communication systems in frequency bands such as microwave band, quasi-millimeter wave band, and millimeter-wave band. In the pulsed radio communication systems, an impulse-type radio communication system has features such that an oscillator and a mixer may not be necessary, and an RF switching section has a simple and low-cost structure in comparison to a narrow band communication system, and wide band radio transmission of a magnitude exceeding 10 Gbps is expected to be realized in a millimeter band where wide band frequencies may be utilized by using the impulse-type radio communication system.

Figure 3A:
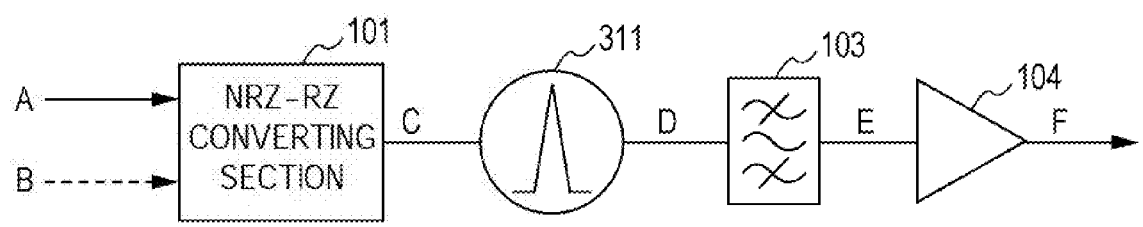
FIG. 3A is a diagram illustrating another structural example of the transmission device.
Figure 3B:
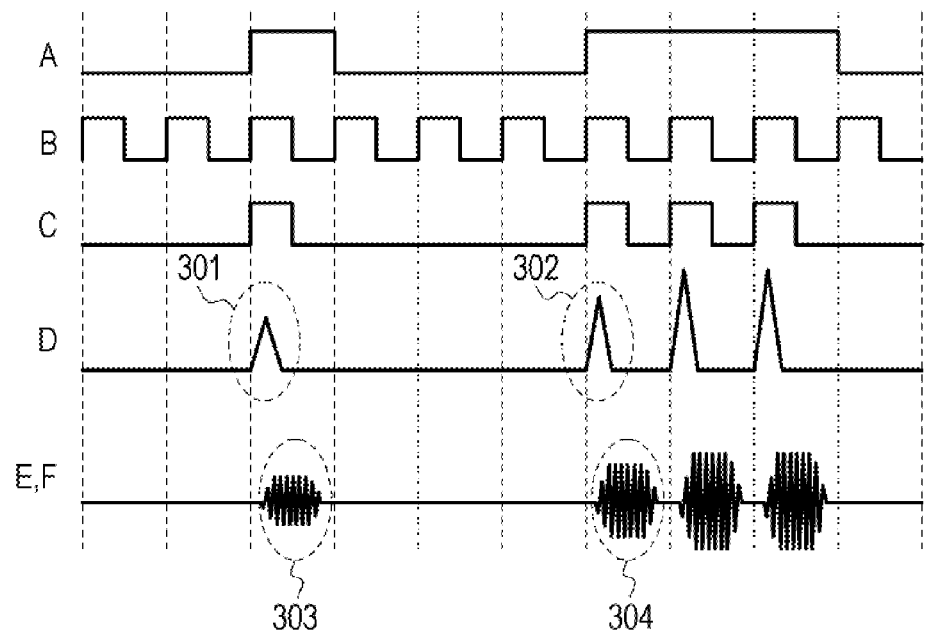
FIG. 3B is a timing chart illustrating an operational example of the transmission device illustrated in FIG. 3A.

FIG. 3A is a diagram illustrating another structural example of the transmission device installed in the pulsed radio communication system illustrated in FIG. 2A and FIG. 3B is a timing chart illustrating an operational example of the transmission device illustrated in FIG. 3A. A non-return-to-zero/return-to-zero (NRZ/RZ) converting section 101 receives data A and a clock signal B from the baseband signal generator 201, and converts the data A from a non-return-to-zero signal to a return-to-zero signal C. When the return-to-zero signal C converted using the non-return-to-zero/return-to-zero converting section 101 turns to a high level pulse, a pulse generating section 311 generates a pulse D. The band-pass filter 103 performs filtering on the pulse D generated from the pulse generating section 311 such that the pulse passes only through a given pass band and outputs a wavelet signal E. The transmission amplifier 104 amplifies the wavelet signal E output from the band-pass filter 103 and outputs a transmission signal F.

The transmission device illustrated in FIG. 3A needs no installation of an RF switch. The pulse generating section 311 branches the return-to-zero signal C into two systems, delays one of the branched signals, and extracts a logical product of overlapping parts of both of the branched signals to generate the pulse D. However, if the frequency band characteristic of the pulse generating section 311 is insufficient, the pulse generating section 311 cannot track the high frequency return-to-zero signal C, pulses 303 and 304 in the wavelet signal E, and the transmission signal F may not attain sufficient amplitudes for one-shot data 301 and data 302 obtained immediately after zeros are generated in succession, and hence the transmission level may be reduced. That is, the amplitude of the successive pulses in the pulse D is gradually increased in accordance with a CR time constant. As a result, the S/N ratio may fluctuate depending on the data pattern and hence the data transmission performance may be deteriorated.

If there is an intention to make the pulse generating section 311 exhibit the sufficient frequency band characteristic, the consumption power and the size of the circuit used may be increased and the device performance may reach its limit. In cable communication such as optical fiber communication, the above mentioned problems may be solved by performing saturation on a transmission signal using a limiting amplifier having sufficient gains such that the signal level of deteriorated one-shot data exceeds a specified value. However, in radio communication, if the transmission signal is saturated, its exclusive frequency band width may be reduced and the RF pulse width may be increased beyond the width of a time slot, and hence inter-symbol interference may be increased.

First Embodiment

Figure 1:
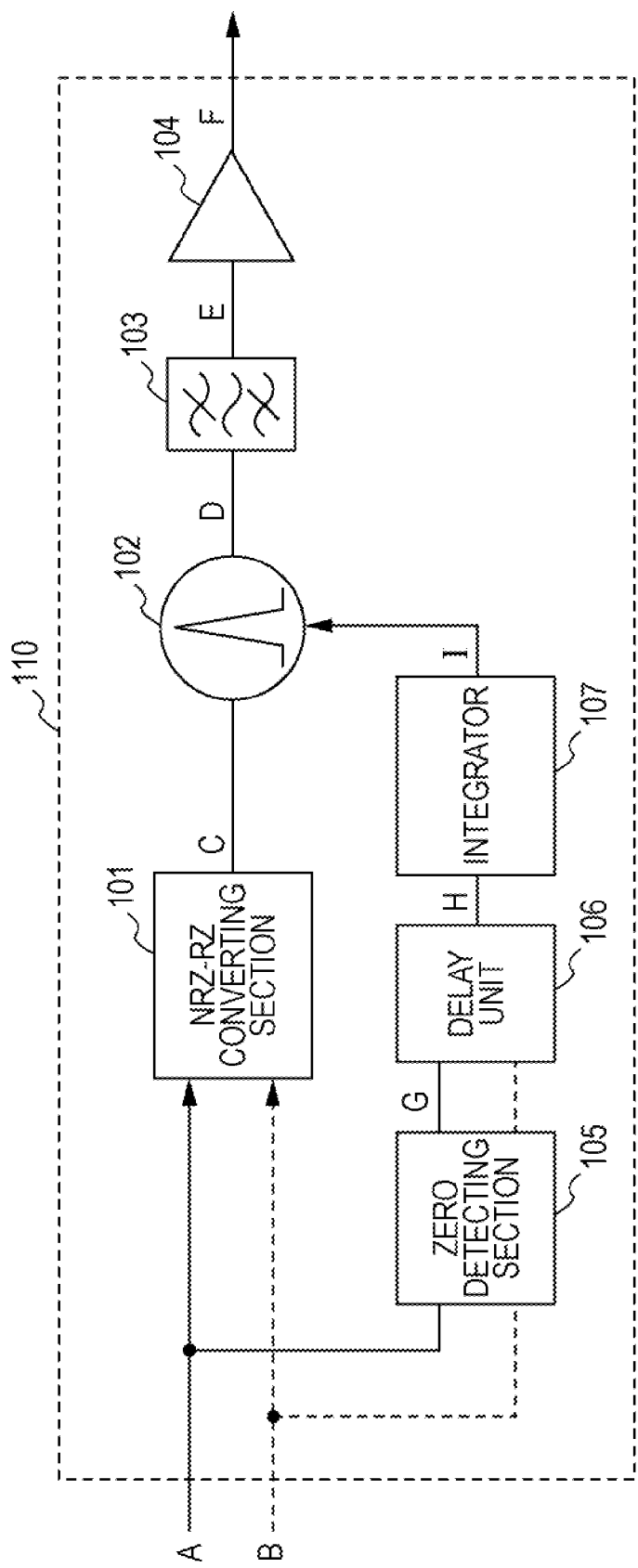
FIG. 1 is a diagram illustrating one structural example of a transmission device according to a first embodiment of the present invention.
Figure 4:
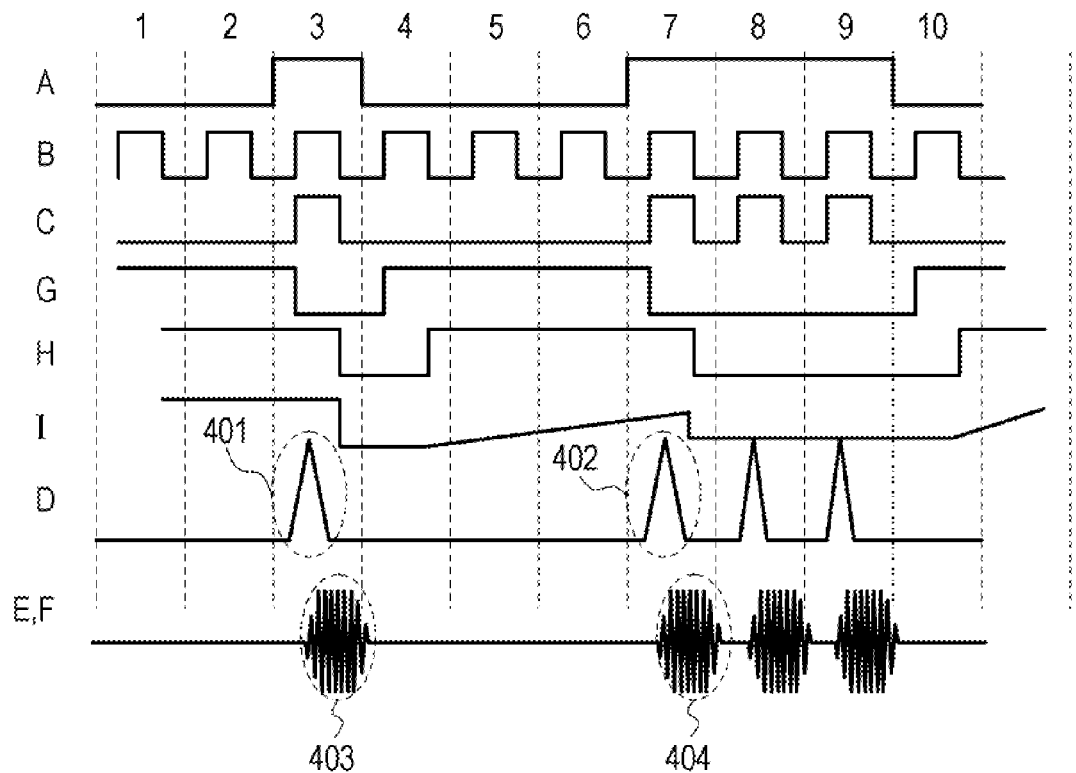
FIG. 4 is a timing chart illustrating an operational example of a transmission circuit according to the first embodiment of the present invention.

FIG. 1 is a diagram illustrating a structural example of a transmission device according to a first embodiment of the present invention. FIG. 4 is a timing chart illustrating an operational example of a transmission circuit of the present invention. Parts other than the transmission device are the same as those in the pulsed radio communication system illustrated in FIG. 2A. In the transmission device, the non-return-to-zero/return-to-zero converting section 101, a pulse generating section 102, the band-pass filter 103, the transmission amplifier 104, a low-level (zero) detecting section 105, a delay unit 106, and an integrator 107 are mounted on a single semiconductor chip 110. As an alternative, the band-pass filter 103 and the transmission amplifier 104 may be installed on the outside of the semiconductor chip 110. Preferably, two or more of the non-return-to-zero/return-to-zero converting section 101, the pulse generating section 102, the band-pass filter 103, and the transmission amplifier 104 are mounted on the single semiconductor chip 110.

The non-return-to-zero/return-to-zero converting section 101 receives the data A and the clock signal B from the baseband signal generator 201 illustrated in FIG. 2A and converts the data A from a non-return-to-zero signal to a return-to-zero signal C.

The low level (zero) detecting section 105 receives the data A and the clock signal B from the baseband signal generator 201 illustrated in FIG. 2A, detects the low level of the data A in the non-return-to-zero signal and outputs a low level detection signal G. The low level detection signal G rises to the high level when the data A is at the low level and drops to the low level when the data A is at the high level. The delay unit 106 delays the low level detection signal G in synchronization with the clock signal B and outputs a signal H. The signal H is delayed from the low level detection signal G by an amount corresponding to about a ½ clock of the clock signal B.

The integrator 107 receives the signal H and performs integration on a capacitor when the signal H is at the high level (the data A is at the low level) to charge the capacitor and causes the capacitance to discharge when the signal H is at the low level (the data A is at the high level) to output a signal I determined based on the voltage of the capacitor. When the data A drops to the low level a plurality of times (N times) in succession, the capacitor of the integrator 107 is saturated, while when the data A rises to the high level once, the capacitor is caused to discharge.

The pulse generating section 102 generates the pulse D of a pulse width conforming to the control signal I in accordance with the return-to-zero signal C. That is, the pulse generating section 102 generates the pulse D of the pulse width conforming to the sequence of the data A. The pulse generating section 102 controls the pulse width of the pulse D such that the pulse width obtained when the data A changes from the low level to the high level is made larger than the pulse width obtained when the data A rises to the high level the plurality of times in succession.

The band-pass filter 103 performs filtering on the pulse D such that the pulse passes through a given pass band and outputs a pulse E. The transmission amplifier 104 amplifies the filtered pulse E and outputs the pulse E as a transmission signal F. The transmission signal F is radio-transmitted via the switch 205 and the antenna 206 illustrated in FIG. 2A.

In this embodiment of the present invention, the pulse generating section 102 capable of adjusting the pulse width is installed and the control signal I output from the integrator 107 is input into a pulse width control terminal of the pulse generating section as a pulse width control signal. The delay unit 106 is installed in order to compensate for a delay time taken for executing a process using the non-return-to-zero/return-to-zero converting section 101. The integrator 107 outputs the control signal I used to perform control such that as the data drops to the low level in succession, the pulse width is increased accordingly. However, the control signal I is brought into saturation when the number of times that the data has dropped to the low level in succession reaches "N" (times). In addition, the control signal I is output to perform control such that the pulse width has a reference value for parts other than a single "1" (the high level) part and a first "1" part of successive "1"s in the data A. For example, as illustrated in FIG. 4, in the data in which "1" is generated immediately after zeros are generated in succession, pulses 401 and 402 of wide widths, that is, the pulses 401 and 402 of relatively narrow frequency bands are generated, so that allowance is yielded in the frequency band characteristic of the pulse generating section 102 and hence the amplitudes of the pulses 401 and 402 may be sufficiently increased. For example, as illustrated in FIG. 4, owing to generation of the pulses 401 and 402, the fluctuations in level of the transmission signal F may be more reduced than when the pulses 301 and 302 of narrow pulse widths and reduced amplitudes are generated and hence the amplitudes of pulses 403 and 404 in the transmission signal F may be made almost constant regardless of the sequence of the data A. That is, it becomes possible to maximize the S/N ratio while avoiding the problem of inter-symbol interference induced by signal saturation.

Figure 5:
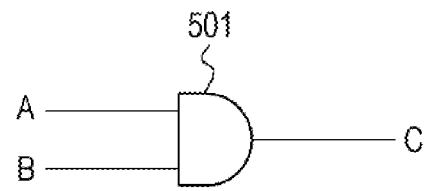
FIG. 5 is a circuit diagram illustrating a structural example of a non-return-to-zero/return-to-zero converting section.

Next, structural examples of respective units installed in the transmission device illustrated in FIG. 1 are illustrated in FIGS. 5 to 7. The transmission device according to the first embodiment of the present invention is configured, for example, using InP-HEMTs (high electron mobility transistors).

FIG. 5 is a circuit diagram illustrating a structural example of the non-return-to-zero/return-to-zero converting section 101 illustrated in FIG. 1. The non-return-to-zero/return-to-zero converting section 101 includes an AND circuit 501. The AND circuit 501 outputs an AND signal obtained from the data A and the clock signal B as a return-to-zero signal C.

Figure 6A:
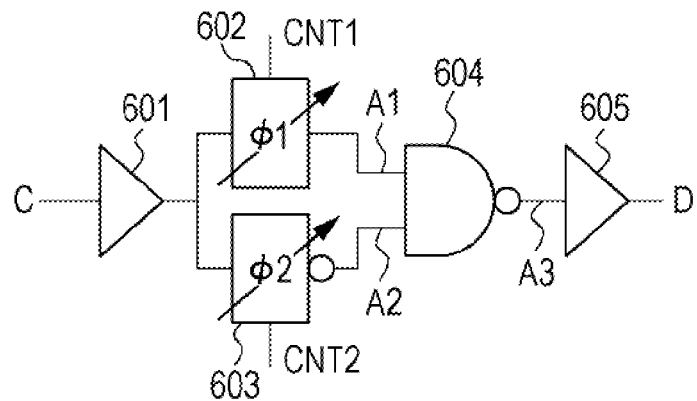
FIG. 6A is a circuit diagram illustrating a structural example of a pulse generating section.
Figure 6B:
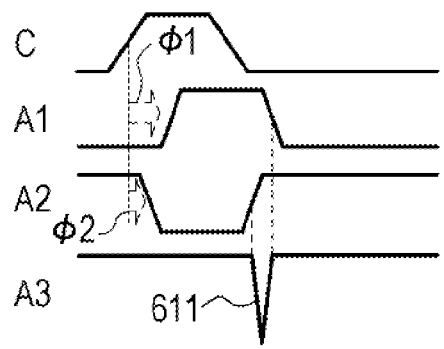
FIG. 6B is a timing chart illustrating an operational example of the pulse generating section illustrated in FIG. 6A.
Figure 6C:
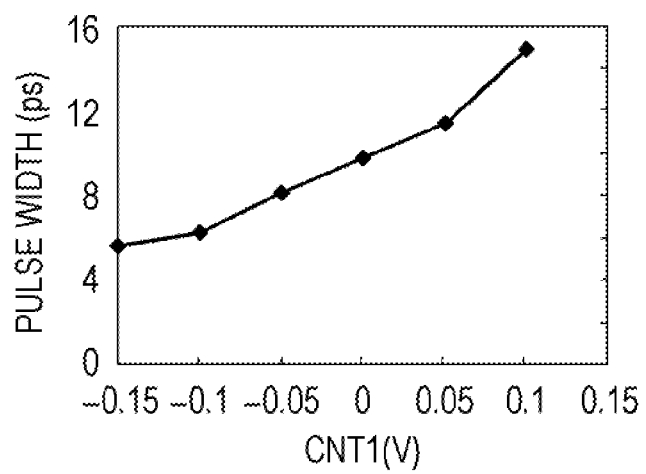
FIG. 6C is a graph illustrating a pulse width control characteristic of the pulse generating section illustrated in FIG. 6A.

FIG. 6A is a circuit diagram illustrating a structural example of the pulse generating section 102 illustrated in FIG. 1, FIG. 6B is a timing chart illustrating an operational example of the pulse generating section 102, and FIG. 6C is a graph illustrating the pulse width control characteristic of the pulse generating section 102. A buffer 601 amplifies the return-to-zero signal C. A delay control buffer 602 delays the output signal from the buffer 601 at a delay time $\phi 1$ determined in accordance with a control signal CNT1 and outputs a signal A1. A delay control buffer 603 delays the output signal from the buffer 601 at a delay time $\phi 2$ determined in accordance with a control signal CNT2 and outputs a signal A2 obtained by inverting the delayed signal. A NAND circuit 604 outputs a NAND signal A3 obtained by NANDing the signals A1 and A2. As a result, a short pulse 611 may be generated, for example, as illustrated in FIG. 6B. A buffer 605 amplifies the NAND signal A3 and outputs a pulse D. As an alternative, the buffer 605 may output the pulse D obtained by inverting the NAND signal A3.

FIG. 6C illustrates the pulse width of the short pulse 611 attained when the control signal CNT2 is fixed at about 0.6V and the voltage of the control signal CNT1 is changed. The more the voltage of the control signal CNT1 is increased, the more the pulse width is increased. The control signal I illustrated in FIG. 1 is input into the delay control buffer 602 as the control signal CNT1.

The pulse generating section 102 branches the return-to-zero signal C into two systems and prepares a slight delay time difference $\phi 1 - \phi 2$ using the delay control buffers 602 and 603 to AND the signals A1 and A2, thereby generating the pulse D. The delay control buffers 602 and 603 are capable of varying the delay times $\phi 1$ and $\phi 2$ using the control signals CNT1 and CNT2.

Figure 8:
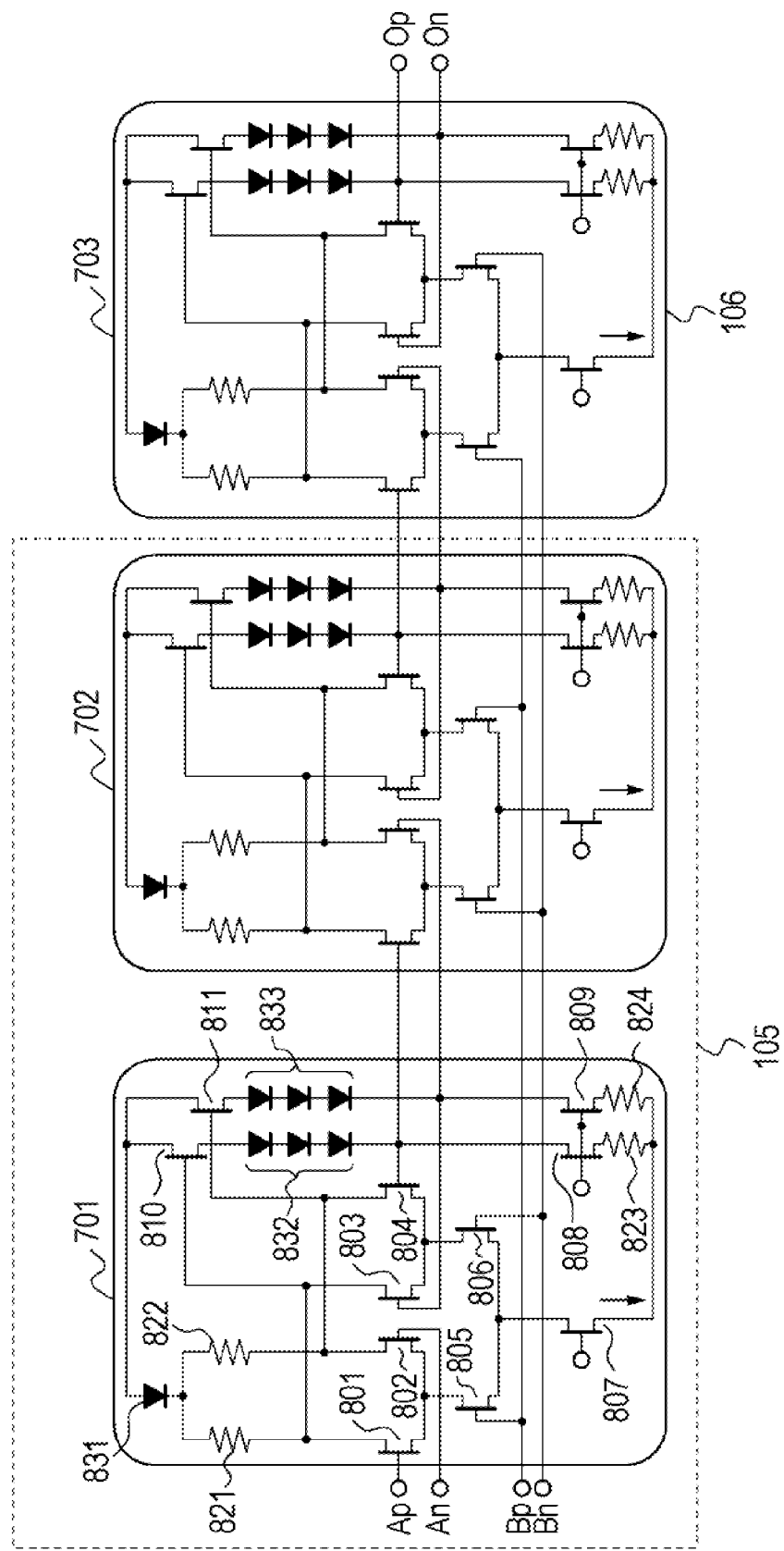
FIG. 8 is a circuit diagram illustrating structural examples of D flip-flop circuits.

FIG. 7 is a circuit diagram illustrating structural examples of the zero detecting section 105, the delay unit 106, and the integrator 107 illustrated in FIG. 1. FIG. 8 is a circuit diagram illustrating structural examples of a master D-latch circuit 701 and slave D-latch circuits 702 and 703 illustrated in FIG. 7.

For example, as illustrated in FIG. 7, the zero detecting section 105 is a master/slave D-type flip-flop circuit including the master D-latch circuit 701 and the slave D-latch circuit 702. The delay unit 106 includes the slave D-latch circuit 703. The integrator 107 includes N-channel field effect transistors 704 and 705 and a capacitor 706.

The data A includes a positive differential signal "Ap" and a negative differential signal "An" which are out of phase with each other. The clock signal B includes a positive differential signal "Bp" and a negative differential signal "Bn" which are out of phase with each other.

For example, as illustrated in FIG. 8, each of the master D-latch circuit 701 and the slave D-latch circuits 702 and 703 includes N-channel field effect transistors 801 to 811, resistors 821 to 824, and diodes 831 to 833. In the master D-latch circuit 701 and the slave D-latch circuit 703, the positive differential signal "Bp" is input into a gate of the N-channel field effect transistor 805 and the negative differential signal "Bn" is input into a gate of the N-channel field effect transistor 806. On the other hand, in the slave D-latch circuit 702, the negative differential signal "Bn" is input into the gate of the N-channel field effect transistor 805 and the positive differential signal "Bp" is input into the gate of the N-channel field effect transistor 806.

The zero detecting section 105 outputs "0" (the low level) when the data A (Ap) is "1" (the high level) and outputs "1" when the data A (Ap) is "0" in synchronization with the leading edge of the clock signal B (Bp). The delay unit 106 is configured as a differential signal circuit and delays the output signal from the zero detecting section 105 by the amount corresponding to a half clock in synchronization with the trailing edge of the clock signal B (Bp) to output a positive differential signal "Op" and a negative differential signal "On." The positive differential signal "Op" and the negative differential signal "On" are out of phase with each other.

The integrator 107 is configured by series-connecting two N-channel field effect transistors 704 and 705 with each other and connecting the capacitor 706 to an inter-connecting point between the transistors 704 and 705. The positive differential signal "Op" is input into a gate of the transistor 704 on the high potential side and the negative differential signal "On" is input into a gate of the transistor 703 on the low potential side.

When the positive differential signal "Op" is "1", that is, the data "Ap" is "0", the N-channel field effect transistor 704 conducts and the N-channel field effect transistor 705 is cut off. Thus, charges are accumulated on the capacitor 706 and the potential of the control signal I to be output from the integrator 107 is gradually increased.

On the other hand, when the positive differential signal is "0", that is, the data "Ap" is "1", the N-channel field effect transistor 705 conducts and the N-channel field effect transistor 704 is cut off. Thus, the charges which have been accumulated on the capacitor 706 are discharged to the ground via the N-channel field effect transistor 705 and hence the potential of the control signal I to be output from the integrator 107 is decreased.

When the number of times that the data "Ap" has turned to "0" in succession reaches "N" (time), the control signal I to be output from the integrator 107 is caused to saturate. Here, the conditions of the N-channel field effect transistors 704 and 705 included in the integrator 107 will be considered. Considering the fact that when the number of times that the data "Ap" has turned to "0" in succession reaches "N", the control signal I is caused to saturate and when the data "Ap" turns to "1" once, all the charges are discharged, the ratio of the gate width (the current value) of the N-channel field effect transistor 704 to that of the N-channel field effect transistor 705 should be set to 1:N. FIG. 4 is the timing chart illustrating an operational example of the transmission device configured as mentioned above.

When the data A is "1", the non-return-to-zero/return-to-zero converting section 101 generates a high level signal C in synchronization with the leading edge of the clock signal B. Simultaneously, the low level detection signal G output from the zero detecting section 105 turns to "0" and the signal H to be input into the integrator 107 drops to the low level, delayed by the amount corresponding to a half clock. As a result, the control signal I to be output from the integrator 107 drops to the low level.

When the data A is "0", the low level detection signal G to be output from the zero detecting section 105 turns to "1" and the start of charging of the integrator 107 is delayed by the amount corresponding to a half clock. As a result, the signal level of the control signal I is increased. This operation is continued until the data A turns to "1" next.

Then, when the data A turns to "1", the pulse generating section 102 intends to output a pulse of a wide pulse width. A pulse having a wide pulse width has a narrow frequency band width, so that it becomes possible for the pulse generating section 102 to track the pulse and hence a pulse having a sufficient amplitude is output. When "1"'s are generated a plurality of times in succession as the data A, the transmission device operates so as to widen the pulse width for the first "1". However, for the second and succeeding "1"'s, the control signal I of the integrator 107 drops to the low level and hence the pulse width is reduced to the standard value.

Second Embodiment

Figure 9:
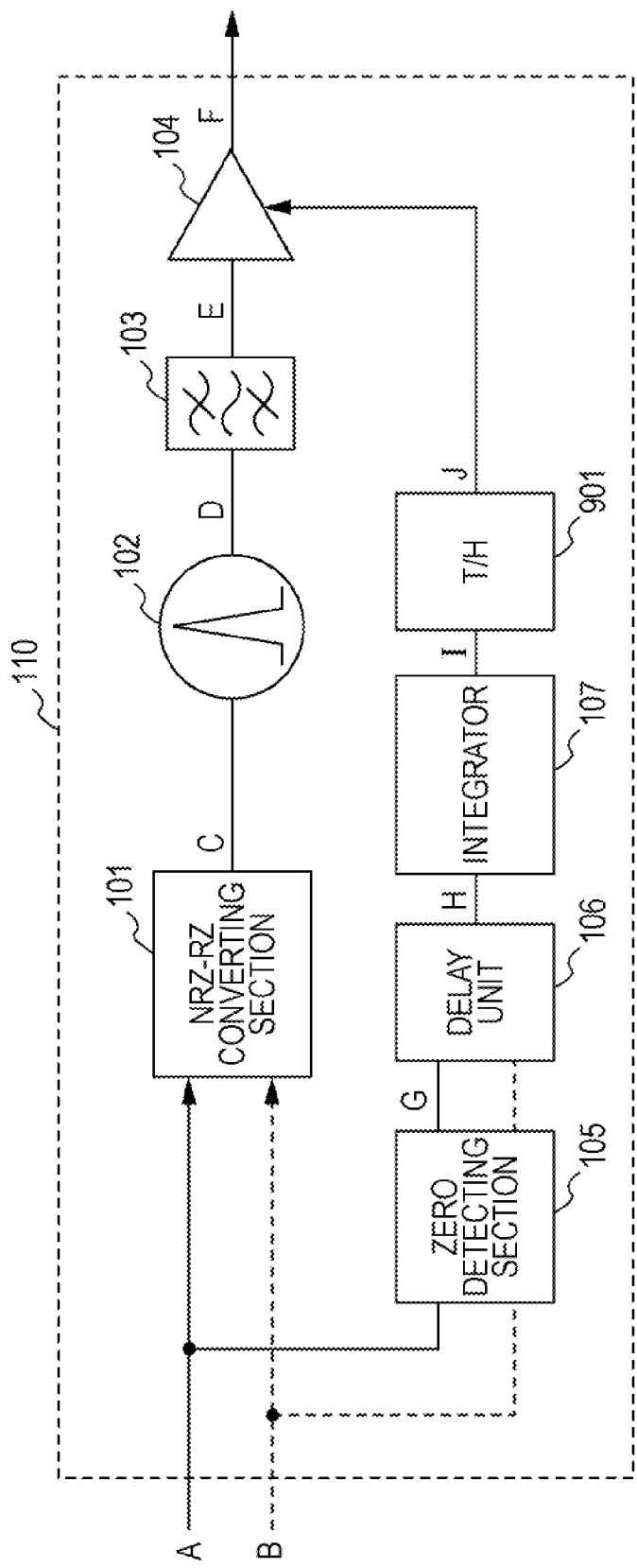
FIG. 9 is a diagram illustrating a structural example of a transmission device according to a second embodiment of the present invention.
Figure 10:
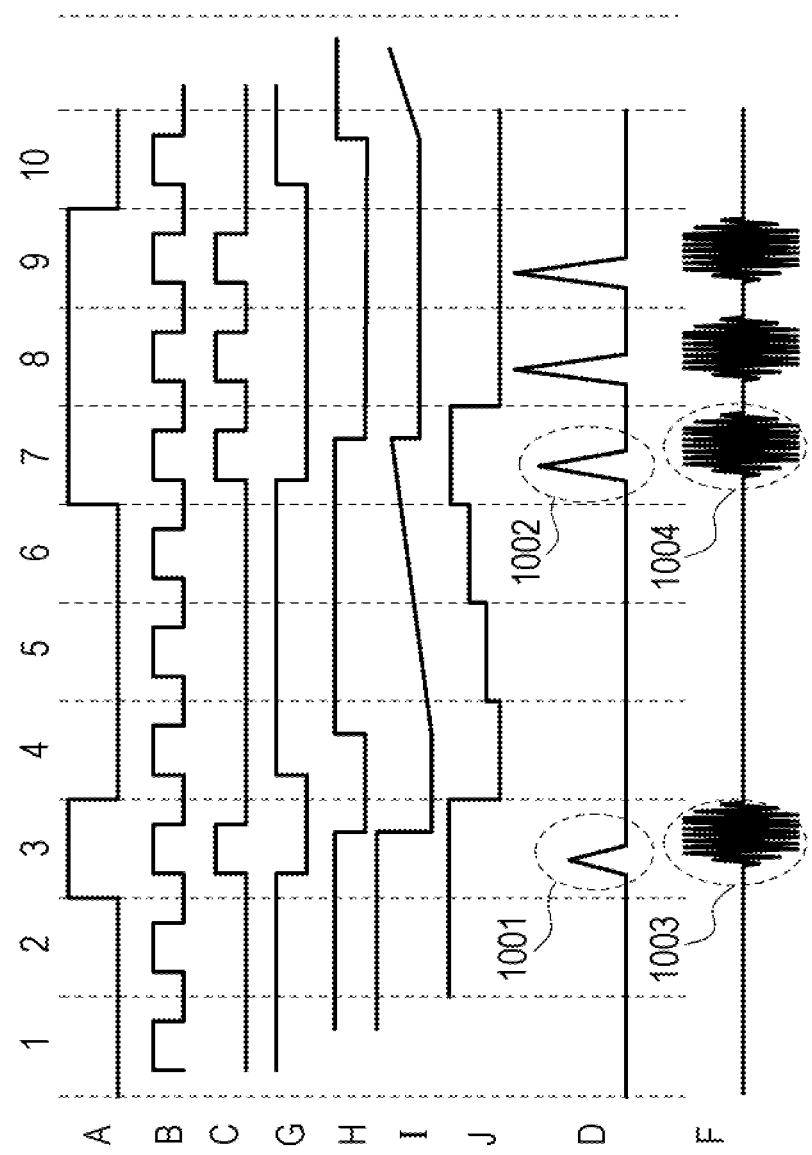
FIG. 10 is a timing chart illustrating a structural example of the transmission device according to the second embodiment of the present invention.

FIG. 9 is a diagram illustrating a structural example of a transmission device according to a second embodiment of the present invention. FIG. 10 is a timing chart illustrating an operational example of the transmission device illustrated in FIG. 9. Parts other than the transmission device are the same as those of the pulsed radio communication system illustrated in FIG. 2A, so that description thereof will be omitted. The system according to the second embodiment is obtained by adding a track and hold circuit 901 to the system according to the first embodiment of the present invention (see FIG. 1). Next, with reference to FIGS. 9 and 10, description will be made, in particular, in relation to points that are different from points of the system according to the first embodiment.

The track and hold circuit 901 tracks and holds the control signal I from the integrator 107 in synchronization with the clock signal B and outputs a control signal J to the transmission amplifier 104. The control signal J is held at the same level in the same time slot. The pulse generating section 102 generates the pulse D of a fixed pulse width regardless of the form of the control signal I. As a result, in the pulse D, the amplitudes of a one-shot pulse 1001 and a first pulse 1002 of successive pulses are reduced (see FIG. 10). The transmission amplifier 104 amplifies the pulse E which has been subjected to filtering at an amplification ratio determined in accordance with the control signal J and outputs the transmission signal F. When the control signal J is at the high level, the transmission amplifier 104 amplifies the pulse E at a high amplification ratio and when the control signal J is at the low level, the amplifier 104 amplifies the pulse E at a low amplification ratio. The transmission amplifier 104 controls the amplification ratio such that the amplification ratio at which the data A changes from the low level to the high level is made higher than the amplification ratio at which the data A rises to the high level a plurality of times in succession. As a result, the amplitudes of wavelets 1003 and 1004 of the transmission signal F may be made constant regardless of the sequence of the data A (see FIG. 10).

In the second embodiment, the control signal I of the integrator 107 is input into the amplification ratio control terminal of the transmission amplifier 104 via the track and hold circuit 901. In the pulse D which is an output from the pulse generating section 102, the amplitudes of the pulses 1001 and 1002 fluctuate influenced by successively generated "0"'s (see FIG. 10). However, the amplification ratio of the transmission amplifier 104 is increased for a part where the amplitude is reduced. In this case, in order to maintain the level of the control signal J constant in the same time slot, the track and hold circuit 901 is installed behind the integrator 107.

Figure 11:
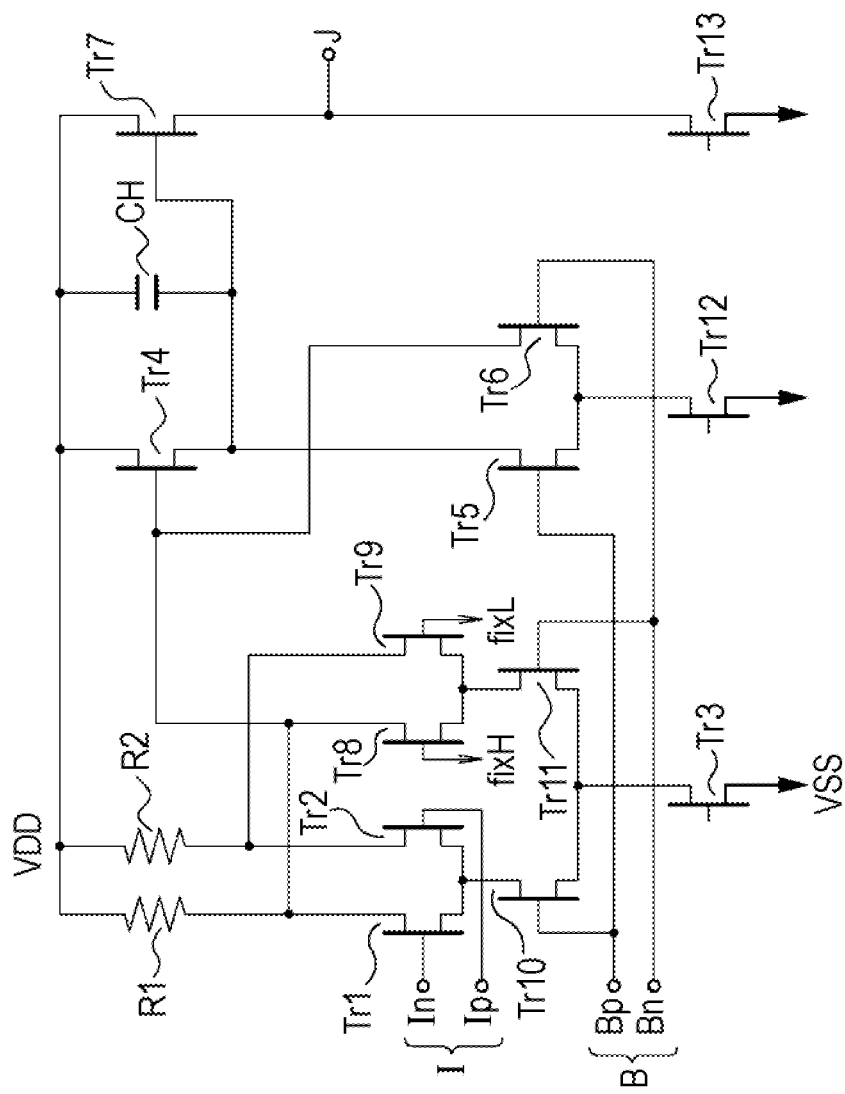
FIG. 11 is a circuit diagram illustrating a structural example of a track and hold circuit.

FIG. 11 is a circuit diagram illustrating a structural example of the track and hold circuit 901 illustrated in FIG. 9. The track and hold circuit 901 has N-channel field effect transistors Tr1 to Tr13, resistors R1 and R2, and a capacitor CH. Bias voltages are applied to the gates of the N-channel field effect transistors Tr3, Tr12, and Tr13. The gate of the N-channel field effect transistor Tr8 is fixed at the high level and the gate of the N-channel field effect transistor Tr9 is fixed at the low level. The control signal I includes a positive differential signal Ip and a negative differential signal In which are out of phase with each other. The clock signal B includes a positive differential signal Bp and a negative differential signal Bn which are out of phase with each other.

Third Embodiment

Figure 12A:
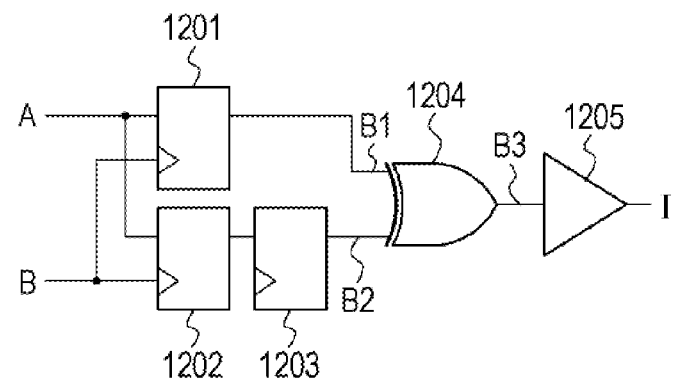
FIG. 12A is a circuit diagram illustrating a structural example of a control circuit according to a third embodiment of the present invention.
Figure 12B:
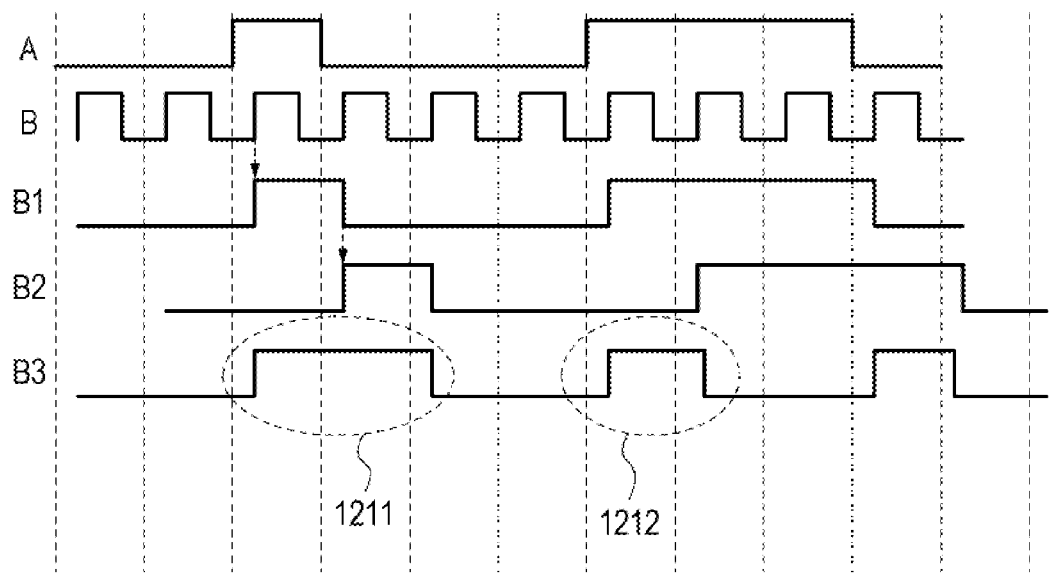
FIG. 12B is a timing chart illustrating an operational example of the control circuit according to the third embodiment of the present invention.

FIG. 12A is a circuit diagram illustrating a structural example of a control circuit and FIG. 12B is a timing chart illustrating an operational example of the control circuit. The control circuit corresponds to the zero detecting section 105, the delay unit 106, and the integrator 107 in the first embodiment (see FIG. 1) and the second embodiment (see FIG. 9) and receives the data A and the clock signal B and outputs the control signal I. The zero detecting section 105, the delay unit 106, and the integrator 107 in the first and second embodiments may be replaced with the control circuit illustrated in FIG. 12A.

A first D-latch circuit 1201 latches the data A in synchronization with the clock signal B and outputs a signal B1. A second D-latch circuit 1202 latches and outputs the data A in synchronization with the clock signal B. A third D-latch circuit 1203 latches the data output from the second D-latch circuit 1202 in synchronization with the clock signal B and outputs a signal B2. The signal B2 is delayed from the signal B1 by the amount corresponding to one clock of the clock signal B. An exclusive OR (XOR) circuit 1204 outputs an exclusive OR signal B3 obtained by performing an exclusive OR operation on the signals B1 and B2. A buffer 1205 amplifies the exclusive OR signal B3 and outputs the control signal I. For example, as illustrated in FIG. 12B, for a one-shot pulse in the data A, a high level pulse 1211 is generated in the exclusive OR signal B3. For a head pulse of successive pulses in the data A, a high level pulse 1212 is generated in the signal B3. As a result, the pulse width is increased in the first embodiment and the amplification rate is increased in the second embodiment. The control signal I is a two-level signal of the high level or the low level.

Although the first and second embodiments illustrate the examples using an analog circuit such as the integrator 107, the third embodiment illustrates an example configured by a digital circuit. The data A is branched into two systems and one signal is delayed from another signal by the amount corresponding to one clock using a series of a first D-latch circuit 1201 of one stage and second D-latch circuits 1202 and 1203 of two stages. When the signals B1 and B2 are input into the exclusive OR circuit 1204, the exclusive OR signal B3 rises to the high level for the single "1" part in the data A and the head of successive "1"s in the data A. For application to the first embodiment, the control signal I is input into the pulse width control terminal of the pulse generating section 102. For application to the second embodiment, the control signal I is input into the amplification ratio control terminal of the transmission amplifier 104 via the track and hold circuit 901. As a result, it becomes possible to increase the pulse widths (in the first embodiment) or the amplification ratios (in the second embodiment) only for the single "1" part and the head of successive "1"s in the data A.

Figure 13A:
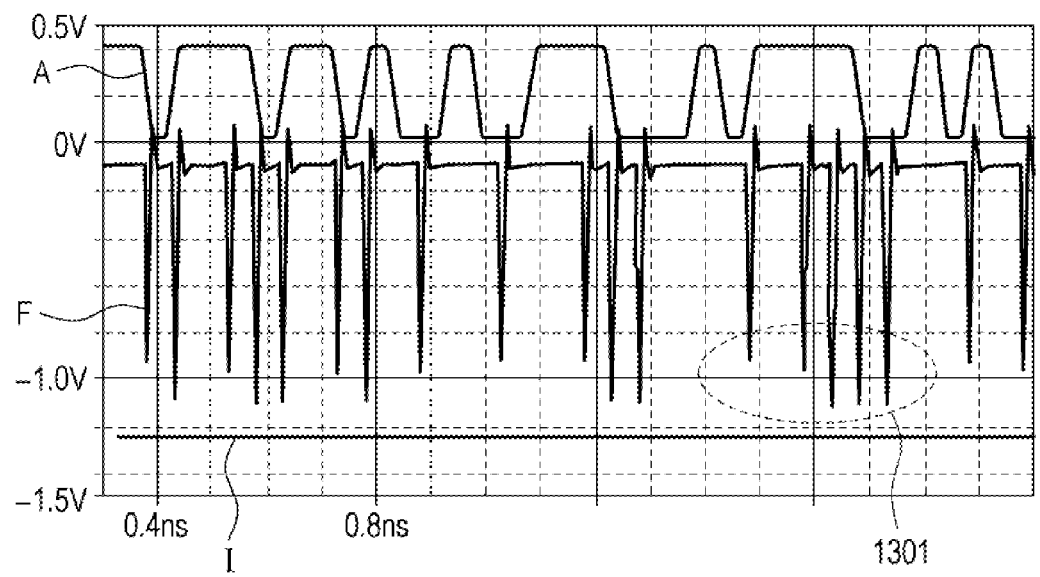
FIG. 13A is one timing chart illustrating the effects obtained when the control circuit illustrated in FIG. 12A has been applied to a transmission circuit of the device illustrated in FIG. 1.
Figure 13B:
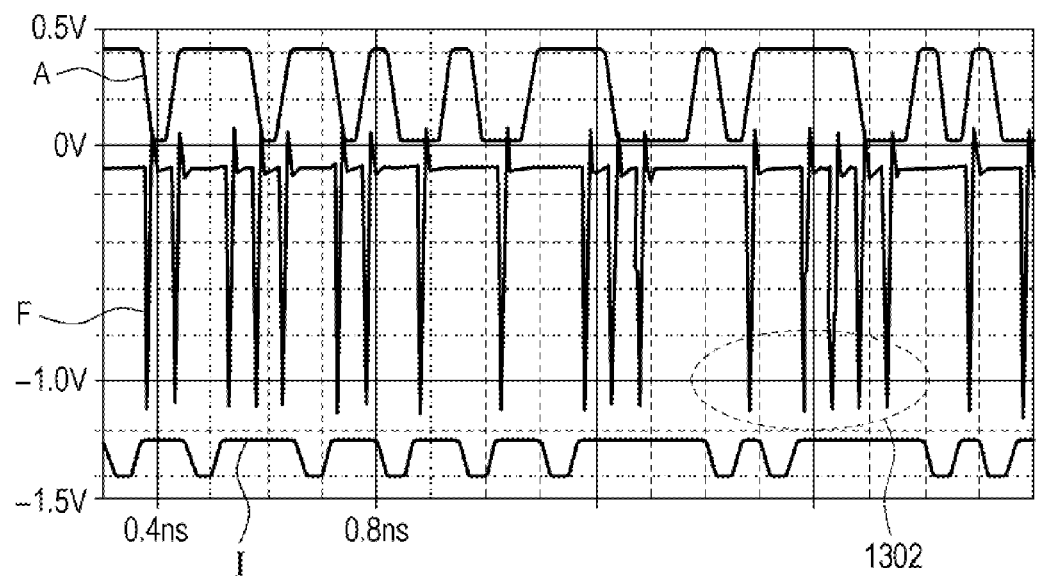
FIG. 13B is another timing chart illustrating the effects obtained when the control circuit illustrated in FIG. 12A has been applied to the transmission circuit of the device illustrated in FIG. 1.

FIGS. 13A and 13B are timing charts illustrating the effects obtained when the control circuit illustrated in FIG. 12A has been applied to the transmission circuit of the device illustrated in FIG. 1.

FIG. 13A illustrates a result of simulation obtained when the voltages of the control signals CNT1 and CNT2 illustrated in FIG. 6A have been fixed. In the example illustrated in FIG. 13A, the control signal CNT1 is fixed at 0V and the control signal CNT2 is fixed at about 0.6V. The control signal I corresponds to the control signal CNT1, that is, corresponds to the signal which is fixed at about 0V in FIG. 6C. The transmission signal F is generated in accordance with the data A. In this case, the width of the pulse generated using the pulse generating section 102 is fixed, so that a variation 1301 in the amplitude of the transmission signal F amounts to about 0.2V.

FIG. 13B illustrates a result of simulation obtained when the control signal I has been input as the control signal CNT1 illustrated in FIG. 6A for the first embodiment. In the example illustrated in FIG. 13B, the voltage of the control signal CNT1 is made variable and the control signal CNT2 is fixed at about 0.6V. The control signal I corresponds to the control signal CNT1, that is, corresponds to a state where the voltage is varied between about 0.03V and about 0V. That is, the voltage of the control signal I amounts to about 0.03V for the single "1" part immediately after successive "0"s in the data A and the head of successive "1"s in the data A and amounts to about 0V for the other parts in the data A. The transmission signal F is generated in accordance with the data A. In this case, the width of the pulse generated using the pulse generating section 102 is made variable, so that a variation in the amplitude of the transmission signal F amounts to about 0.02V, that is, the variation is reduced to about 1/10 the variation 1301 of the example illustrated in FIG. 13A.

In the example illustrated in FIG. 13A, the pulse amplitude variation 1301 amounting to about 0.2 (about 20%) is induced. On the other hand, in the example illustrated in FIG. 13B, the amplitude variation may be reduced to as small as about 0.02V (about 2%). Owing to the reduction of variation, the S/N ratio of the transmission device may be improved to about 2 dB, which means that radio waves may be spread out over a distance which is longer than that ever attained by about 25%, when this improvement in the S/N ratio is converted to communication distance. As described above, according to the first to third embodiments of the present invention, the fluctuation of the output level which depends on the data pattern (in particular, the pattern in which "0"s are generated in succession) may be reduced without greatly affecting the consumption power and the circuit size and hence it becomes possible to improve the quality of the transmission signal.

Fourth Embodiment

Figure 14:
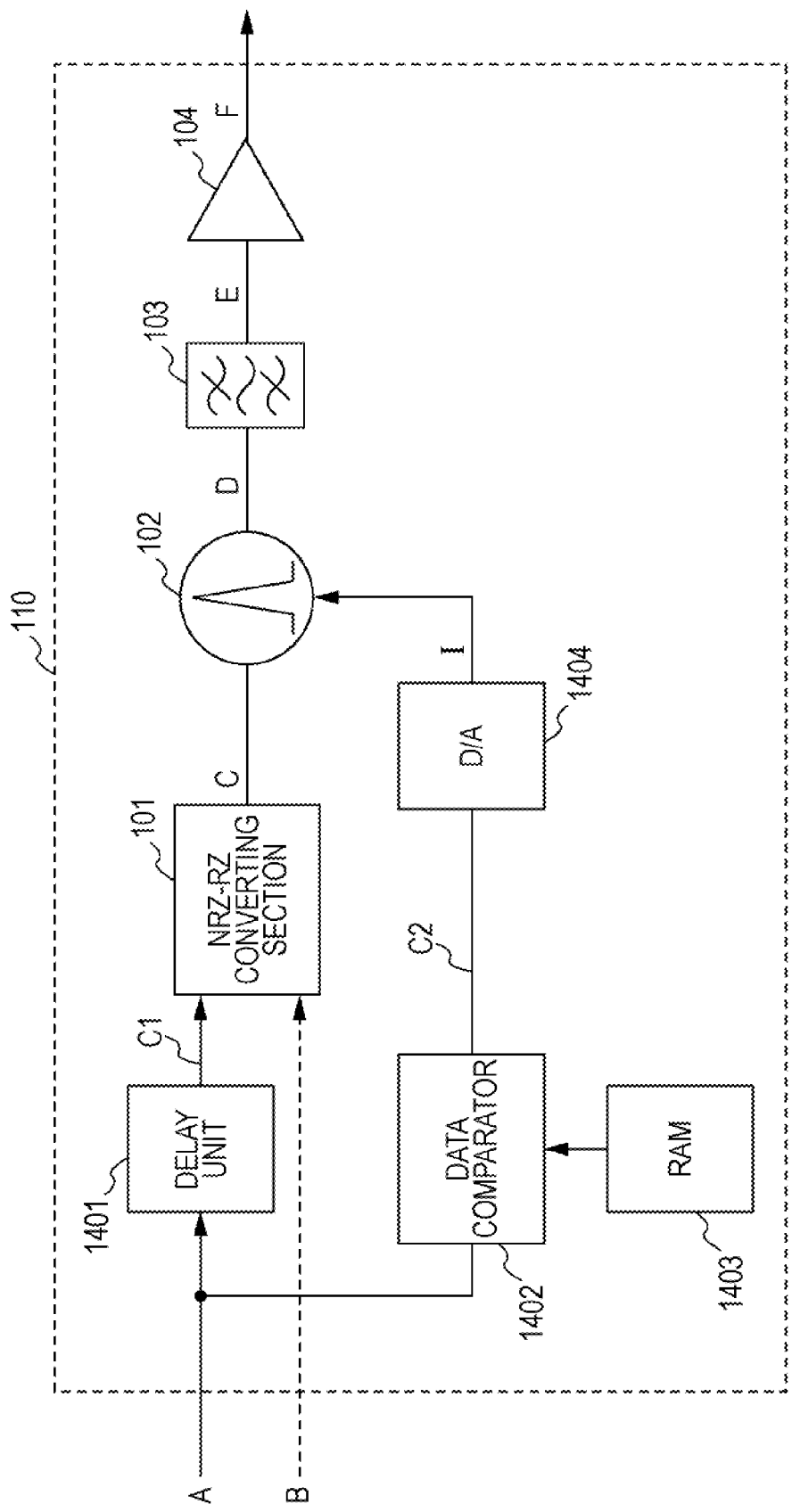
FIG. 14 is a diagram illustrating a structural example of a transmission device according to a fourth embodiment of the present invention.

FIG. 14 is a diagram illustrating a structural example of a transmission device according to a fourth embodiment of the present invention. Parts other than the transmission device are the same as those in the pulsed radio communication system illustrated in FIG. 2A. In this embodiment (FIG. 14), the zero detecting section 105, the delay unit 106, and the integrator 107 in the first embodiment (FIG. 1) are eliminated and a delay unit 1401, a data comparator 1402, a RAM 1403, and a digital/analog converter 1404 are added. Next, description will be made, in particular, in relation to parts different from those in the first embodiment.

The RAM 1403 stores a table that stores corresponding relations between the sequence (pattern) of the data A and a control signal C2. As described above, for the single "1" part in the data A and the head of successive "1"s in the data A, the control signal C2 rises to the high level. The data comparator 1402 outputs the control signal C2 corresponding to the sequence of the data A, with reference to the RAM 1403. The digital/analog converter 1404 converts the control signal C2 from a digital form to an analog form and outputs an analog control signal I to the pulse generating section 102. The pulse generating section 102 generates a pulse of a pulse width determined in accordance with the control signal I. In the above mentioned manner, the variation in the amplitude of the transmission signal F may be eliminated.

The delay unit 1401 outputs data C1 which is delayed from the data A in order to adjust timings of the return-to-zero signal C and the control signal I to be input into the pulse generating section 102. The non-return-to-zero/return-to-zero converting section 101 converts the data C1 from a non-return-to-zero signal to a return-to-zero signal C.

As described above, the data comparator 102 compares the pattern of the input data A with a data pattern which has been registered in advance in the RAM 1403 and outputs an optimum control signal C2 in the digital form. The digital/analog converter 1404 converts the control signal C2 which has been input thereinto as the digital signal into an analog signal and outputs the control signal I to the pulse generating section 102. In the above mentioned manner, it becomes possible to supply the highly accurate control signal I in accordance with the pattern of the input data A.

The fourth embodiment may also be applied to the second embodiment. In this case, the RAM 1403 stores therein the corresponding relations between the sequence of the data A and the control signal C2. The digital/analog converter 1404 may output the control signal I to the transmission amplifier 104 via the track and hold circuit 901 as in the case illustrated in FIG. 9.

Fifth Embodiment

Figure 15:
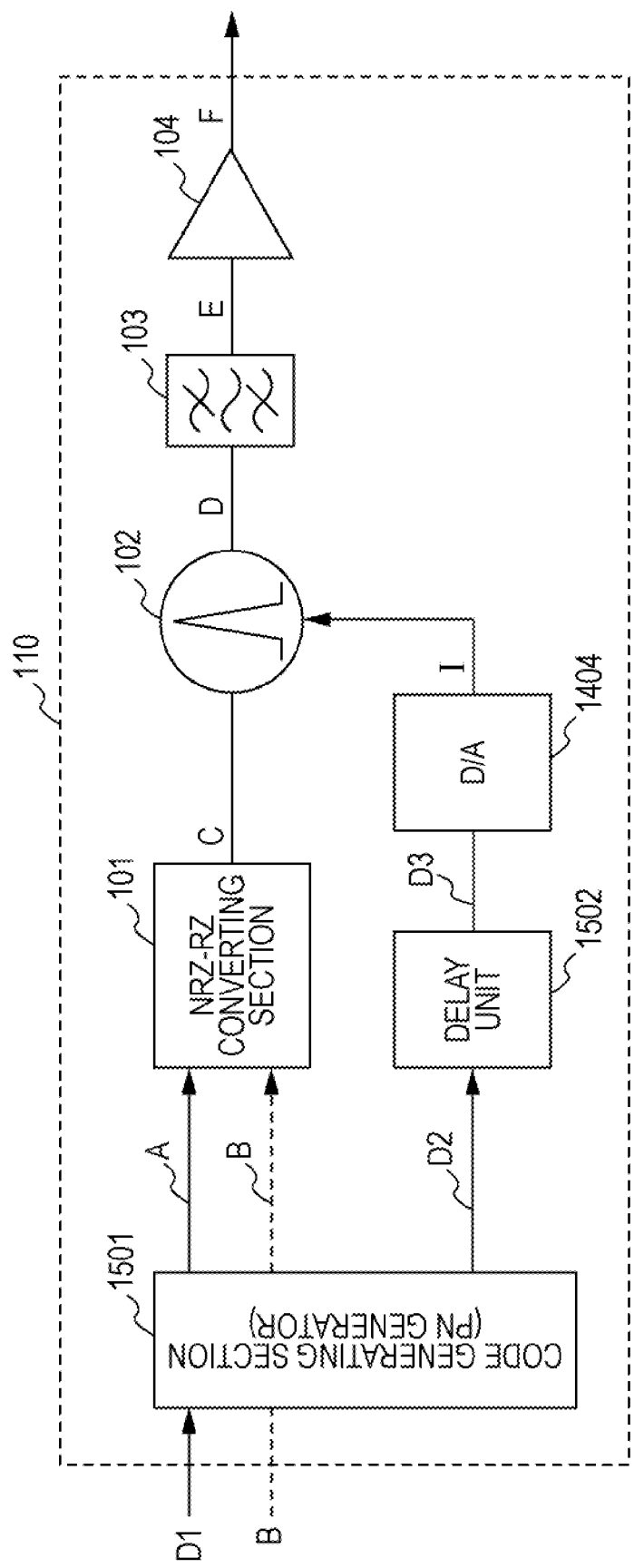
FIG. 15 is a diagram illustrating a structural example of a transmission device installed in a pulsed radar system according to a fifth embodiment of the present invention.

FIG. 15 is a diagram illustrating a structural example of a transmission device installed in a pulsed radar system according to a fifth embodiment of the present invention. Parts other than the transmission device are the same as those in the pulsed radio communication system illustrated in FIG. 2A. In the fifth embodiment (FIG. 15), the zero detecting section 105, the delay unit 106, and the integrator 107 in the first embodiment (see FIG. 1) are eliminated and a code generating section 1501, a delay unit 1502, and the digital/analog converter 1404 are added. Next, description will be made, in particular, in relation to parts different from those in the first embodiment.

The pulsed radar system is capable of measuring a distance between the pulse radar system and an object in accordance with a difference between a transmission time and a reception time obtained by transmitting a transmission signal to the object and receiving a signal reflected by the object. In the above mentioned case, the transmission device installed in the pulsed radar system needs to measure the distance based on the reflection signal of the signal that the transmission device has transmitted, so that a self-identification code is included as data in the transmission signal.

The code generating section 1501 is configured by, for example, a Pseudo Noise (PN) generator which operates so as to generate, when a distance measurement start signal D1 is input thereinto, a self-identification code in synchronization with a clock signal B and output the code as data A to the non-return-to-zero/return-to-zero converting section 101. The code generating section 1501 also outputs a pulse width control signal D2 corresponding to the data A of the self-identification code. The delay unit 1502 delays the pulse width control signal D2 in order to compensate for a delay time taken to execute a process using the non-return-to-zero/return-to-zero converting section 101 and outputs a control signal D3. The digital/analog converter 1404 converts the form of the control signal D3 from the digital form to the analog form and outputs a control signal I in the analog form to the pulse generating section 102. The pulse generating section 102 generates a pulse of a pulse width corresponding to the control signal I. In the above mentioned manner, the variation in amplitude of the transmission signal F can be eliminated.

The fifth embodiment may be applied to the second embodiment. In the above mentioned case, the code generating section 1501 outputs a signal corresponding to the sequence of the data A, that is, the amplification ratio control signal D2. The digital/analog converter 1404 may output the control signal I to the transmission amplifier 104 via the track and hold circuit 901 as in the case illustrated in FIG. 9.

As described above, with the use of the transmission device according to the first to fifth embodiments of the present invention, the amplitude of the transmission signal may be maintained almost constant regardless of the sequence of the data by controlling the pulse width or the amplification ratio in accordance with the sequence of the data. In addition, a high-band and high speed RF switch is not used, so that the size and the cost of the transmission device may be reduced.

Further, the S/N ratio may be improved and transmission of high quality may be realized without greatly affecting the consumption power and the circuit size.

In the first to fifth embodiments, examples using the InP-HEMT have been described. However, a similar device may be configured by a Si-CMOS and a bipolar transistor.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A transmission device comprising:
a pulse generating section configured to generate a plurality of pulses using a signal of data and a signal obtained by delaying the signal of the data,
and to adjust the pulse width such that each of the plurality of pulses has a pulse width conforming to a sequence of the data;
a band-pass filter filtering the plurality of pulses;
a transmission amplifier amplifying the filtered plurality of pulses and outputting the filtered plurality of pulses as a transmission signal; and
an integrator performing integration on a capacitor when the data is at a low level to charge the capacitor and causing the capacitor to discharge when the data is at a high level, thereby outputting a control signal based on the voltage of the capacitor, wherein
the pulse generating section adjusts the pulse width in accordance with the control signal.

2. The transmission device according to claim 1, further comprising:
a low-level detecting section configured to detect the low level of the data and to output a low level detection signal; and a delay unit configured to delay the low level detection signal, wherein
the integrator performs integration based on the delayed low level detection signal.

3. The transmission device according to claim 1, wherein the integrator causes the capacitor to saturate when the data drops to the low level a plurality of times in succession, and causes the capacitor to discharge when the data rises to the high level once.

4. The transmission device according to claim 1, wherein the pulse generating section adjusts the pulse width such that the pulse width obtained when the data changes from the low level to the high level is wider than the pulse width obtained when the data rises to the high level a plurality of times in succession.

5. The transmission device according to claim 1, further comprising:
a first flip flop circuit configured to latch the data;
a second flip flop circuit configured to latch the data;
a third flip flop circuit configured to latch the data output from the second flip flop circuit; and
an exclusive-OR circuit configured to output an exclusive-OR signal obtained by performing an exclusive-OR operation on the output signals from the first and third flip flop circuits, wherein
the pulse generating section adjusts the pulse width in accordance with the exclusive-OR signal.

6. The transmission device according to claim 1, further comprising:
a table configured to store corresponding relations between the sequence of the data and the control signal, wherein
the pulse generating section adjusts the pulse width in accordance with the control signal.

7. The transmission device according to claim 1, further comprising:
a code generating section configured to generate a code for self-identification and outputting the code for self-identification as the data.

8. The transmission device according to claim 1, further comprising:
a non-return-to-zero/return-to-zero converting section configured to convert the data from a non-return-to-zero signal to a return-to-zero signal, and outputting the return-to-zero signal to the pulse generating section as a data signal.

9. A transmission device comprising:
a pulse generating section configured to generate a plurality of pulses in accordance with a signal of data;
a band-pass filter configured to filter the plurality of pulses;
a transmission amplifier configured to amplify each of the filtered plurality of pulses at an amplification ratio conforming to a sequence of the data, and to output the amplified plurality of pulses as a transmission signal; and
an integrator performing integration on a capacitor when the data is at a low level to charge the capacitor and causing the capacitor to discharge when the data is at a second logical level, thereby outputting a control signal based on the voltage of the capacitor, wherein
the transmission amplifier amplifies each of the plurality of pulses at an amplification ratio conforming to the control signal.

10. The transmission device according to claim 9, further comprising:
a track and hold circuit configured to track and hold the control signal output from the integrator and to output the tracked and held signal to the transmission amplifier.

11. The transmission device according to claim 10, further comprising:
a low level detecting section configured to detect the low level of the data and to output a low level detection signal; and
a delay unit configured to delay the low level detection signal, wherein
the integrator performs integration based on the delayed low level detection signal.

12. The transmission device according to claim 9, wherein the integrator causes the capacitor to saturate when the data drops to the low level a plurality of times in succession, and causes the capacitor to be charged when the data rises to the high level once.

13. The transmission device according to claim 9, wherein the transmission amplifier controls the amplification ratio such that the amplification ratio at which the data changes from the low level to the high level is higher than the amplification ratio at which the data rises to the high level a plurality of times in succession.

14. The transmission device according to claim 9, further comprising:
a first flip flop circuit configured to latch the data;
a second flip flop circuit configured to latch the data;
a third flip flop circuit configured to latch the data output from the second flip flop circuit; and
an exclusive-OR circuit configured to output an exclusive-OR signal obtained by performing an exclusive-OR operation on output signals from the first and third flip flop circuits, wherein
the transmission amplifier amplifies each of the plurality of pulses at an amplification ratio conforming to the exclusive-OR signal.

15. The transmission device according to claim 14, further comprising:
a track and hold circuit configured to track and hold the exclusive-OR signal output from the exclusive-OR circuit and to output the tracked and held signal to the transmission amplifier.

16. The transmission device according to claim 9, further comprising:
a table configured to store corresponding relations between the sequence of the data and the control signal, wherein
the transmission amplifier amplifies each of the plurality of pulses at an amplification ratio conforming to the control signal.

17. The transmission device according to claim 9, further comprising:
a code generating section configured to generate a code for self identification and to output the code for self identification as the data.

18. The transmission device according to claim 9, further comprising:
a non-return-to-zero/return-to-zero converting section configured to convert the data to a return-to-zero signal and to output the return-to-zero signal to the pulse generating section as a signal of data.

* * * * *